(12) United States Patent
Nagasaka

(10) Patent No.: US 8,982,322 B2
(45) Date of Patent: Mar. 17, 2015

(54) EXPOSURE APPARATUS AND DEVICE MANUFACTURING METHOD

(75) Inventor: Hiroyuki Nagasaka, Kumagaya (JP)

(73) Assignee: Nikon Corporation, Tokyo (JP)

( * ) Notice: Subject to any disclaimer, the term of this patent is extended or adjusted under 35 U.S.C. 154(b) by 1168 days.

(21) Appl. No.: 11/717,748

(22) Filed: Mar. 14, 2007

(65) Prior Publication Data

US 2007/0216884 A1 Sep. 20, 2007

(30) Foreign Application Priority Data

Mar. 17, 2006 (JP) ................................. 2006-074243

(51) Int. Cl.
G03B 27/42 (2006.01)
G03F 7/20 (2006.01)

(52) U.S. Cl.
CPC ............ G03B 27/42 (2013.01); G03F 7/70283 (2013.01); G03F 7/70466 (2013.01)
USPC ...................... 355/67; 355/46; 355/53; 355/77

(58) Field of Classification Search
CPC ............ G03F 7/70275; G03F 7/70283; G03F 7/70466; G03F 7/70475; G02B 27/42
USPC ........... 355/52, 30, 55, 40, 44–46, 67–71, 53, 355/72, 75, 77; 250/492.1, 492.2, 492.22; 430/311, 321, 312
See application file for complete search history.

(56) References Cited

U.S. PATENT DOCUMENTS

| 3,656,849 A | * | 4/1972 | Lu ..................................... 355/46 |
| 4,982,227 A | * | 1/1991 | Suzuki .............................. 355/53 |
| 5,418,599 A | * | 5/1995 | Kamon ............................. 355/77 |
| 5,482,819 A | * | 1/1996 | Tjhia et al. ..................... 430/394 |
| 5,617,182 A | * | 4/1997 | Wakamoto et al. ............. 355/53 |
| 5,969,441 A | | 10/1999 | Loopstra et al. |
| 5,989,761 A | * | 11/1999 | Kawakubo et al. ............. 430/22 |
| 6,341,007 B1 | | 1/2002 | Nishi et al. |
| 6,383,940 B1 | * | 5/2002 | Yoshimura .................... 438/708 |
| 6,400,441 B1 | | 6/2002 | Nishi et al. |
| 6,549,269 B1 | | 4/2003 | Nishi et al. |
| 6,590,634 B1 | | 7/2003 | Nishi et al. |
| 6,608,681 B2 | | 8/2003 | Tanaka et al. |
| 6,778,257 B2 | | 8/2004 | Bleeker et al. |

(Continued)

FOREIGN PATENT DOCUMENTS

EP 1 280 007 A2 1/2003
JP A 60-134240 7/1985

(Continued)

OTHER PUBLICATIONS

May 29, 2007 International Search Report in PCT/JP2007/055399 (with English translation).

(Continued)

Primary Examiner — Christina Riddle
(74) Attorney, Agent, or Firm — Oliff PLC

(57) ABSTRACT

An exposure apparatus provided with an optical system that has one optical element to which at least two of three or more exposure lights are guided, and that is capable of irradiating three or more exposure lights onto exposure fields that respectively correspond to the exposure lights, with the exposure apparatus multiply exposing a predetermined field on a substrate with images of a plurality of patterns that are formed based on the three or more exposure lights that are respectively irradiated onto the three or more exposure fields.

23 Claims, 7 Drawing Sheets

(56) References Cited

U.S. PATENT DOCUMENTS

| | | |
|---|---|---|
| 6,831,768 B1 * | 12/2004 | Cebuhar et al. ............ 359/291 |
| 6,897,963 B1 | 5/2005 | Taniguchi et al. |
| 6,980,280 B2 * | 12/2005 | Roddy et al. .............. 355/67 |
| 7,209,217 B2 * | 4/2007 | Troost ........................ 355/67 |
| 2002/0015919 A1 * | 2/2002 | Kristensen et al. ......... 430/321 |
| 2002/0123012 A1 | 9/2002 | Sewell |
| 2002/0177057 A1 * | 11/2002 | Grodnensky ................ 430/30 |
| 2003/0030781 A1 | 2/2003 | Bleeker et al. |
| 2003/0128347 A1 * | 7/2003 | Case et al. .................. 355/53 |
| 2005/0142458 A1 * | 6/2005 | Lee et al. ..................... 430/5 |
| 2005/0248856 A1 | 11/2005 | Omura et al. |
| 2006/0012766 A1 * | 1/2006 | Klosner et al. ............. 355/67 |
| 2006/0017902 A1 * | 1/2006 | Rhyzhikov et al. ......... 355/67 |
| 2006/0139603 A1 * | 6/2006 | Lin ............................. 355/67 |
| 2007/0153247 A1 * | 7/2007 | Nagasaka .................... 355/53 |

FOREIGN PATENT DOCUMENTS

| | | | |
|---|---|---|---|
| JP | A 08-313842 | 11/1996 | |
| JP | A 09-266150 | 10/1997 | |
| JP | A 10-163099 | 6/1998 | |
| JP | A 10-214783 | 8/1998 | |
| JP | A 11-135400 | 5/1999 | |
| JP | 2000021748 A * | 1/2000 | ............ H01L 21/027 |
| JP | A 2000-021742 | 1/2000 | |
| JP | A 2000-505958 | 5/2000 | |
| JP | A 2000-164504 | 6/2000 | |
| JP | A 2001-510577 | 7/2001 | |
| JP | A 2001-297976 | 10/2001 | |
| JP | A-2001-297976 | 10/2001 | |
| JP | A 2003-100626 | 4/2003 | |
| JP | A 2004-519850 | 7/2004 | |
| JP | A 2004-304135 | 10/2004 | |
| WO | WO 99/23692 A1 | 5/1999 | |
| WO | WO 99/28790 A1 | 6/1999 | |
| WO | WO 99/49504 A1 | 9/1999 | |
| WO | WO 2004/019128 A2 | 3/2004 | |
| WO | WO 2005/059617 A2 | 6/2005 | |
| WO | WO 2005/059618 A2 | 6/2005 | |

OTHER PUBLICATIONS

May 29, 2007 Written Opinion in PCT/JP2007/055399 (with English translation).

* cited by examiner

EXPOSURE APPARATUS AND DEVICE MANUFACTURING METHOD

CROSS-REFERENCE TO RELATED APPLICATION

Priority is claimed on Japanese Patent Application No. 2006-074243, filed Mar. 17, 2006, the content of which is incorporated he by reference.

BACKGROUND OF THE INVENTION

1. Field of the Invention

The present invention relates to an exposure apparatus that exposes a substrate, and a device manufacturing method.

2. Description of Related Art

In an exposure apparatus used in a photolithography process, there is known an exposure apparatus that multiply exposes a substrate, for example as disclosed in Japanese Unexamined Patent Application, First Publication No. H10-214783.

In multiple exposure, there is the case where a plurality of masks are prepared, and exposure is executed for each of the masks, and a plurality of illumination conditions are prepared, and exposure is executed for each of the illumination conditions. In this case, time is needed for changing the masks, and for changing the illumination conditions and the like, and hence there is the possibility of a drop in the operation rate of the exposure apparatus and a drop in throughput.

A purpose of some aspects of the invention is to provide an exposure apparatus that can restrict drops in throughput and multiply expose a substrate with good efficiency, and a device manufacturing method.

SUMMARY

According to a first aspect of the present invention, for example, in an exposure apparatus that exposes a substrate, there is provided an exposure apparatus comprising an optical system that has one optical element to which at least two of three or more exposure lights are guided, and that irradiates three or more exposure fields with the three or more exposure lights, and wherein a predetermined field on the substrate is multiply exposed by images of a plurality of patterns that are formed based on the three or more exposure lights irradiated onto the three or more exposure fields, respectively.

According the first aspect of the present invention, the substrate can be multiply exposed with good efficiency.

According to a second aspect of the present invention, there is provided a device manufacturing method that uses the exposure apparatus of the aforementioned aspect.

According to the second aspect of the present invention, a device can be manufactured using an exposure apparatus that can multiply expose a substrate with good efficiency.

DETAILED DESCRIPTION OF THE INVENTION

Hereunder is a description of embodiments of the present invention, with reference to the drawings. However, the present invention is not limited to this description. In the following description, an XYZ rectangular co-ordinate system is established, and the positional relationship of respective members is described with reference to this XYZ rectangular co-ordinate system. A predetermined direction within a horizontal plane is made the X-axis direction, a direction orthogonal to the X-axis direction in the horizontal plane is made the Y-axis direction, and a direction orthogonal to both the X-axis direction and the Y-axis direction (that is, a perpendicular direction) is made the Z-axis direction. Furthermore, rotation (inclination) directions about the X axis, the Y axis and the Z axis, are made the θX, the θY, and the θZ directions, respectively.

<First Embodiment>

Figure 1:
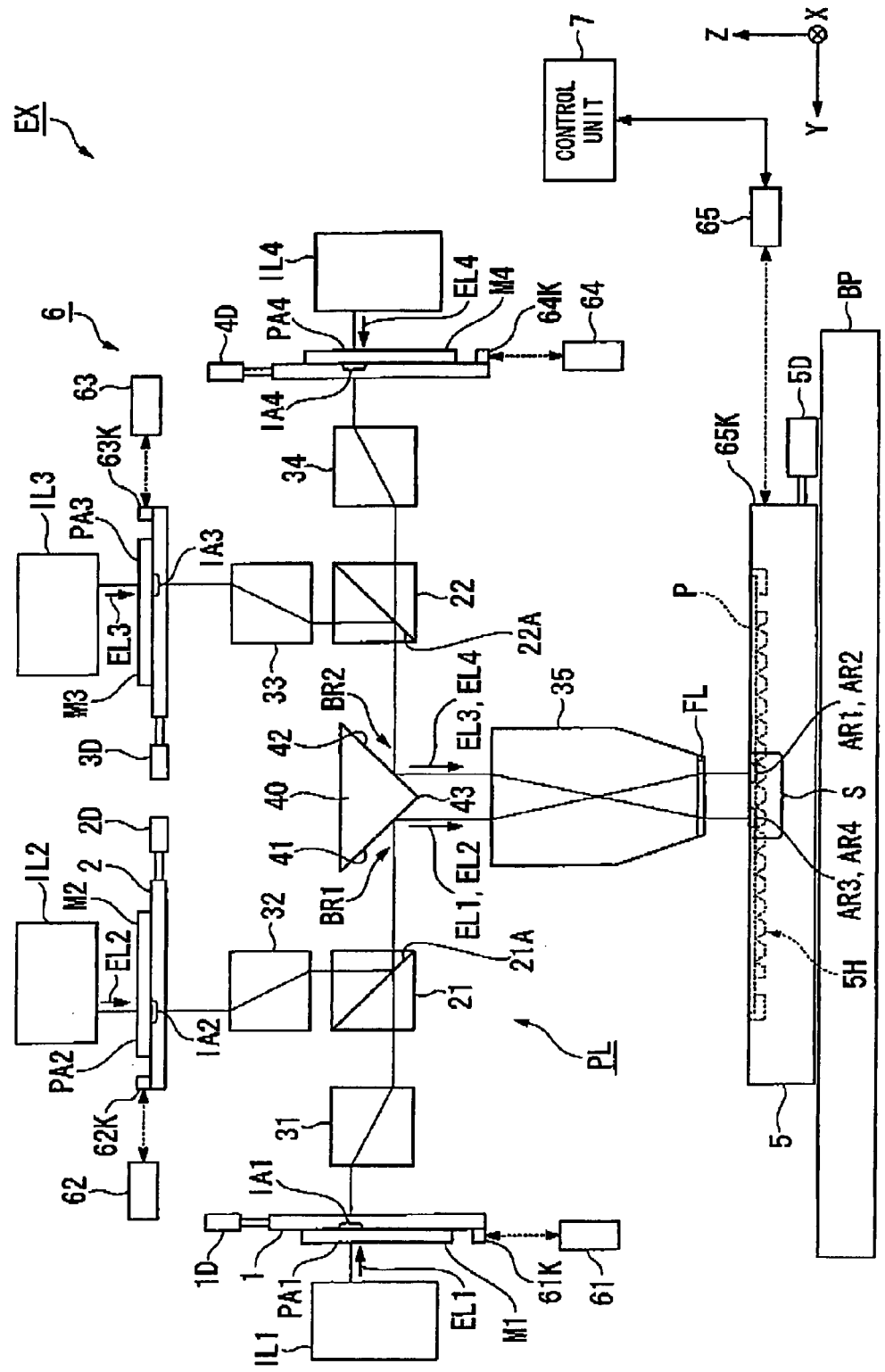
FIG. 1 is a schematic block diagram showing an exposure apparatus according to a first embodiment.

A first embodiment will be described. FIG. 1 is a schematic block diagram showing an exposure apparatus EX to the first embodiment. In this embodiment, the exposure apparatus EX comprises a projection optical system PL having one optical element FL to which at least two of three or more exposure lights are guided, and that is capable of irradiating three or more exposure fields with corresponding exposure lights. The exposure apparatus EX of the present embodiment multiply exposes a shot field S on a substrate P with images of a plurality of patterns that are formed (projected) on the three or more exposure fields which are irradiated by the corresponding exposure lights.

In the present embodiment, four exposure lights, specifically, first, second, third, and fourth exposure lights EL1, EL2, EL3, and EL4, are guided to the optical element FL. Furthermore, in the present embodiment, the optical element FL is disposed at a position facing the surface of the substrate P. In the present embodiment, the optical element FL is the optical element closest to the image surface of the projection optical system PL among the plurality of optical elements of the projection optical system PL. In the following description, the optical element FL of the projection optical system PL facing the surface of the substrate P is appropriately called the final optical element FL.

The projection optical system FL of the present embodiment sets a first exposure field AR1, a second exposure field AR2, a third exposure field AR3, and a fourth exposure field AR4 in a predetermined positional relationship at adjacent to the light emission side of the projection optical system PL, that is, the image surface side of the projection optical system PL. The first, second, third, and fourth expose fields AR1, AR2, AR3, and AR4 are set to correspond to the first, second, third, and fourth exposure lights EL1, EL2, EL3, and EL4. The projection optical system PL irradiates the first, second, third, and fourth exposure lights EL1, EL2, EL3, and EL4 on the respective first, second, third, and fourth exposure fields AR1, AR2, AR3, and AR4 corresponding to the exposure lights EL1, EL2, EL3, and EL4.

The exposure apparatus EX of the present apparatus is capable of forming an image of a first pattern PA1 on the first exposure field AR1 based on the first exposure light EL1 that is irradiated on the first exposure field AR1, is capable of forming an image of a second pattern PA2 on the second exposure field AR2 based on the second exposure light EL2 that is irradiated on the second exposure field AR2, is capable of forming an image of a third pattern PA3 on the third exposure field AR3 based on the third exposure light EL3 that is irradiated on the third exposure field AR3, and is capable of forming an image of a fourth pattern PA4 on the fourth exposure field AR4 based on the fourth exposure light EL4 that is irradiated on the fourth exposure field AR4, by use of the projection optical system PL. The exposure apparatus EX multiply exposes the shot field S on the substrate P with the images of the first, second, third, and fourth patterns PA1, PA2, PA3, and PA4 that are formed based on the first, second, third, and fourth exposure lights EL1, EL2, EL3, and EL4 respectively irradiated on the first, second, third, and fourth exposure fields AR1, AR2, AR3, and AR4.

In FIG. 1, the exposure apparatus EX includes a first mask stage 1 that is capable of holding and moving a first mask M1 having the first pattern PA1, a second mask stage 2 that is capable of holding and moving a second mask M2 having the second pattern PA2, a third mask stage 3 that is capable of holding and moving a third mask M3 having the third pattern PA3, a fourth mask stage 4 that is capable of holding and moving a fourth mask M4 having the fourth pattern PA4, a substrate stage 5 that is capable of holding and moving the substrate P, and a measurement system 6 that is capable of measuring position information of the stages. The exposure apparatus EX further includes a first illumination system IL1 that illuminates the first pattern PA1 of the first mask M1 with the first exposure light EL1, a second illumination system IL2 that illuminates the second pattern PA2 of the second mask M2 with the second exposure light EL2, a third illumination system IL3 that illuminates the third pattern PA3 of the third mask M3 with the third exposure light EL3, a fourth illumination system IL4 that illuminates the fourth pattern PA4 of the fourth mask M4 with the fourth exposure light EL4, the projection optical system PL, and a control unit 7 that controls the operation of the overall exposure apparatus EX. The projection optical system PL forms an image of the first pattern PA1 illuminated by the first exposure light EL1, an image of the second pattern PA2 illuminated by the second exposure light EL2, an image of the third pattern PA3 illuminated by the third exposure light EL3, and an image of the fourth pattern PA4 illuminated by the fourth exposure light EL4 on the first exposure field AR1, the second exposure field AR2, the third exposure field AR3, and the fourth exposure field AR4, respectively.

Substrate here includes one in which a photosensitive material (photoresist) is coated on a substrate such as a semiconductor wafer such as a silicon wafer and includes one in which various films such as a protective film (topcoat film) separate from the photosensitive film are coated. The mask includes a reticle on which is formed a device pattern to be projected in a reduced size onto the substrate, and includes one where a predetermined pattern is formed using a light shielding membrane such as chrome or the like on a transparent member such as a glass plate. This transmission-type mask is not limited to a binary mask on which a pattern is formed with a shading film, and also includes, for example, a phase shift mask such as a half-tone type or a spatial frequency modulation type. Furthermore, in the present embodiment, a transmission-type mask is used for the mask, however a reflection-type mask can be used. Furthermore, in the present embodiment, the first, second, third, and fourth patterns PA1, PA2, PA3, and PA4 are mutually different patterns. Moreover, the masks M1 to M4 can be of the same type, and can be different types. For example, some of the masks M1 to M4 can be binary masks, and the others can be phase-shift reticles.

The exposure apparatus EX of the present embodiment is a scanning-type exposure apparatus (a so-called scanning stepper) that projects the images of the first, second, third, and fourth patterns PA1, PA2, PA3, and PA4 of the first, second, third, and fourth masks M1, M2, M3, and M4 onto the substrate P, while the first, second, third, and fourth masks M1, M2, M3, and M4 and the substrate P are simultaneously moved in a predetermined scanning direction. In the present embodiment, the scanning direction (the simultaneous movement direction) of the substrate P is the Y axis direction. The exposure apparatus EX, while moving the shot field S of the substrate P in the Y-axis direction with respect to the first, second, third, and fourth exposure fields AR1, AR2, AR3, and AR4, respectively irradiates the first, second, third, and fourth exposure lights EL1, EL2, EL3, and EL4 onto the first, second, third, and fourth exposure fields AR1, AR2, AR3, and AR4 via the projection optical system PL. Thereby, the shot field S of the substrate P is multiply exposed with the images of the first, second, third, and fourth patterns PA1, PA2, PA3, and PA4 that are formed based on the first, second, third, and fourth exposure lights EL1, EL2, EL3, and EL4 irradiated onto the first, second, third, and fourth exposure fields AR1, AR2, AR3, and AR4, respectively. Furthermore, the exposure apparatus EX of the present embodiment, in synchronous with the movement in the Y-axis direction of the substrate P, moves the first mask M1 in the Z-axis direction with respect to the first exposure light EL1 using the first mask stage 1, moves the second mask M2 in the Y-axis direction with respect to the second exposure light EL2 using the second mask stage 2, moves the third mask M3 in the Y-axis direction with respect to the third exposure light EL3 using the third mask stage 3, and moves the fourth mask M4 in the Z-axis direction with respect to the fourth exposure light EL4 using the fourth mask stage 4. That is, in the present embodiment, the scanning direction (synchronous movement direction) of the first and fourth masks M1 and M4 is the Z-axis direction, and the scanning direction (synchronous movement direction) of the second and third masks M2 and M3 is the Y-axis direction.

Next is a description of the first, second, third and fourth illumination systems IL1, IL2, IL3, and IL4. The first illumination system IL1 illuminates a first illumination field IA1 on the first mask M1 held in the first mask stage 1 with the first exposure light EL1 of a uniform luminance distribution. The second illumination system IL2 illuminates a second illumination field IA2 on the second mask M2 held in the second mask stage 2 with the second exposure light EL2 of a uniform luminance distribution. The third illumination system IL3 illuminates a third illumination field IA3 on the third mask M3 held in the third mask stage 3 with the third exposure light EL3 of a uniform luminance distribution. The fourth illumination system IL4 illuminates a fourth illumination field IA4 on the fourth mask M4 held in the fourth mask stage 4 with the fourth exposure light EL4 of a uniform luminance distribution. For the first, second, third, and fourth exposure lights EL1, EL2, EL3, and EL4 respectively emitted from the first, second, third, and fourth illumination systems IL1, IL2, IL3, and IL4, for example emission lines (g-ray, h-ray, i-ray), emitted for example from a mercury lamp, deep ultraviolet beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm), can be used. In this embodiment, the ArF excimer laser beam is used for the first, second, third, and fourth exposure lights EL1, EL2, EL3, and EL4.

The exposure apparatus EX of the present embodiment has a first light source device corresponding to the first illumination system IL1, a second light source device corresponding to the second illumination system IL2, a third light source device corresponding to the third illumination system IL3, and a fourth light source device corresponding to the fourth illumination system IL4. That is, the exposure apparatus EX of the present embodiment has a plurality of light source devices (laser emitting devices). Furthermore, the first, second, third, and fourth illumination systems IL1, IL2, IL3, and IL4 illuminate the first, second, third, and fourth patterns PA1, PA2, PA3, and PA4, respectively, with the first, second, third, and fourth exposure lights EL1, EL2, EL3, and EL4 of a random polarization (non-polarized condition). The exposure light emitted from one light source device is branched into the first, second, third, and fourth exposure lights EL1, EL2, EL3, and EL4 by a branching optical element, and the first, second, third, and fourth patterns PA1, PA2, PA3, and PA4 can be illuminated by these first, second, third, and fourth exposure lights EL1, EL2, EL3, and EL4.

Next is a description of the first, second, third, and fourth mask stages 1, 2, 3, and 4. The first mask stage 1 is moveable by driving of a first mask stage drive device 1D which includes an actuator such as a linear motor, in the Z axis, the X axis, and the θY directions in a condition with the first mask M1 held. The first mask stage 1 holds the first mask M1 so that a first pattern forming surface on which the first pattern PA1 of the first mask M1 is formed is substantially parallel with the XZ plane. Position information of the first mask stage 1 (and in turn the first mask M1) is measured by a laser interferometer 61 of the measurement system 6. The laser interferometer 61 measures the position information of the first mask stage 1 using a reflecting surface 61K of a moving mirror provided on the first mask stage 1. The control, unit 7 drives the first mask stage drive device 1D based on the measurement result of the laser interferometer 61, to perform position control of the first mask M1 which is held on the first mask stage 1.

The second mask stage 2 is moveable by driving of a second mask stage drive device 2D which includes an actuator such as a linear motor, in the X axis, the Y axis, and the θZ directions in a condition with the second mask M2 held. The second mask stage 2 holds the second mask M2 so that a second pattern forming surface on which the second pattern PA2 of the second mask M2 is formed is substantially parallel with the XY plane. Position information of the second mask stage 2 (and in turn the second mask M2) is measured by a laser interferometer 62 of the measurement system 6. The laser interferometer 62 measures the position information of the second mask stage 2 using a reflecting surface 62K of a moving mirror provided on the second mask stage 2. The control unit 7 drives the second mask stage drive device 2D based on the measurement result of the laser interferometer 62, to perform position control of the second mask M2 which is held on the second mask stage 2.

The third mask stage 3 is moveable by driving of a third mask stage drive device 3D which includes an actuator such as a linear motor, in the X axis, the Y axis, and the θZ directions in a condition with the third mask M3 held. The third mask stage 3 holds the third mask M3 so that a third pattern forming surface on which the third pattern PA3 of the third mask M3 is formed is substantially parallel with the XY plane. Position information of the third mask stage 3 (and in turn the third mask M3) is measured by a laser interferometer 63 of the measurement system 6. The laser interferometer 63 measures the position information of the third mask stage 3 using a reflecting surface 63K of a moving minor provided on the third mask stage 3. The control unit 7 drives the third mask stage drive device 3D based on the measurement result of the laser interferometer 63, to perform position control of the third mask M3 which is held on the third mask stage 3.

The fourth mask stage 4 is moveable by driving of a fourth mask stage drive device 4D which includes an actuator such as a linear motor, in the Z axis, the X axis, and the θY directions in a condition with the fourth mask M4 held. The fourth mask stage 4 holds the fourth mask M4 so that a fourth pattern forming surface on which the fourth pattern PA4 of the fourth mask M4 is formed is substantially parallel with the XZ plane. Position information of the fourth mask stage 4 (and in turn the fourth mask M4) is measured by a laser interferometer 64 of the measurement system 6. The laser interferometer 64 measures the position information of the fourth mask stage 4 using a reflecting surface 64K of a moving mirror provided on the fourth mask stage 4. The control unit 7 drives the fourth mask stage drive device 4D based on the measurement result of the laser interferometer 64, to perform position control of the fourth mask M4 which is held on the fourth mask stage 4.

Figure 2A:
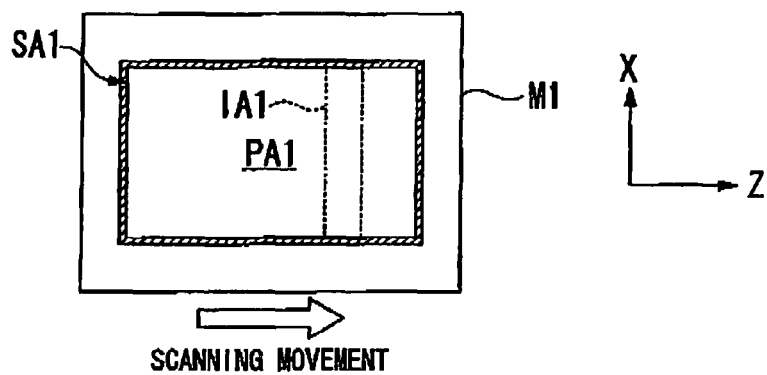
FIG. 2A is a diagram showing an example of a mask which is held in a mask stage in the first embodiment.
Figure 2B:
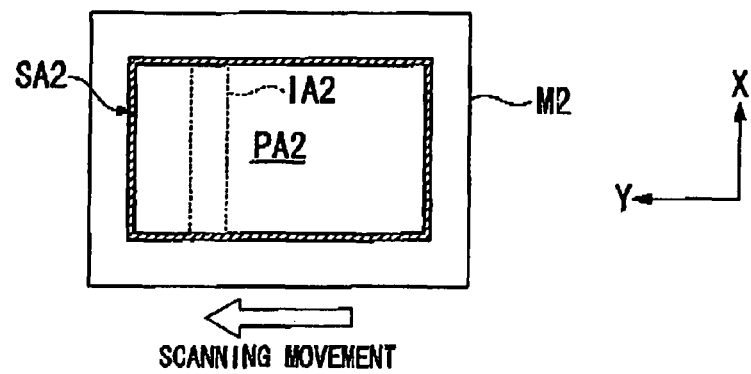
FIG. 2B is a diagram showing an example of a mask which is held in a mask stage in the first embodiment.
Figure 2C:
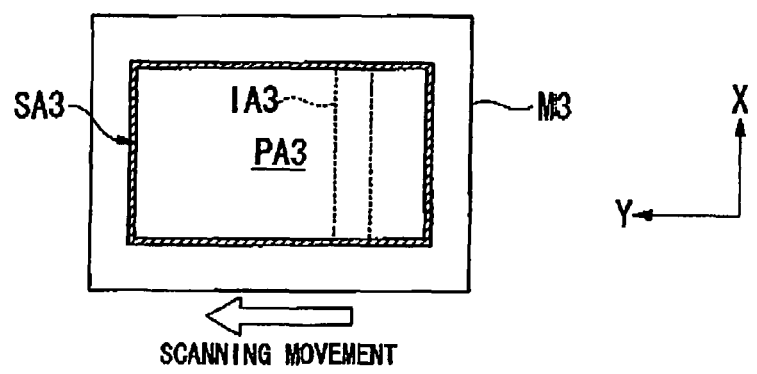
FIG. 2C is a diagram showing an example of a mask which is held in a mask stage in the first embodiment.
Figure 2D:
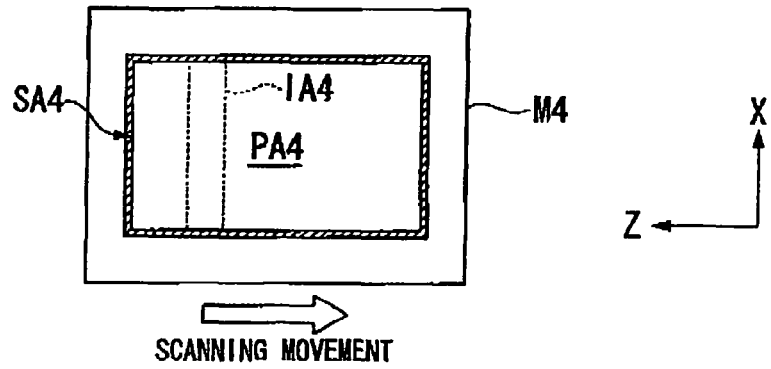
FIG. 2D is a diagram showing an example of a mask which is held in a mask stage in the first embodiment.

FIG. 2A is a plan view showing the first mask M1 held on the first mask stage 1. FIG. 2B is a plan view showing the second mask M2 held on the second mask stage 2. FIG. 2C is a plan view showing the third mask M3 held on the third mask stage 3. FIG. 2D is a plan view showing the fourth mask M4 held on the fourth mask stage 4. The first illumination field IA1 due to the first exposure light EL1 on the first mask M1 is set in a rectangular shape (slit shape) with the X axis direction as the longitudinal direction. The second illumination field IA2 due to the second exposure light EL2 on the second mask M2 is also set in a rectangular shape (slit shape) with the X axis direction as the longitudinal direction. The third illumination field IA3 due to the third exposure light EL3 on the third mask M3 is also set in a rectangular shape (slit shape) with the X axis direction as the longitudinal direction. The fourth illumination field IA4 due to the fourth exposure light EL4 on the fourth mask M4 is also set in a rectangular shape (slit shape) with the X axis direction as the longitudinal direction.

The first mask stage 1 is capable of moving the first mask M1 having the first pattern PA1 in the Z axis direction with respect to the first exposure light EL1. The second mask stage 2 is capable of moving the second mask M2 having the second pattern PA2 in the Y axis direction with respect to the second exposure light EL2. The third mask stage 3 is capable of moving the third mask M3 having the third pattern PA3 in the Y axis direction with respect to the third exposure light EL3. The fourth mask stage 4 is capable of moving the fourth mask M4 having the fourth pattern PA4 in the Z axis direction with respect to the fourth exposure light EL4.

The control unit 7, when exposing the substrate P, controls the first mask stage 1 so that a first pattern forming field SA1 of the first mask M1 in which is formed at least the first pattern PA1 passes through the first illumination field IA1 due to the first exposure light EL1, and thereby moves the first mask M1 in the Z axis direction. Furthermore, the control unit 7, when exposing the substrate P, controls the second mask stage 2 so that a second pattern forming field SA2 of the second mask M2 in which is formed at least the second pattern PA2 passes through the second illumination field IA2 due to the second exposure light EL2, and thereby moves the second mask M2 in the Y axis direction. Furthermore, the control unit 7, when exposing the substrate P, controls the third mask stage 3 so that a third pattern forming field SA3 of the third mask M3 in which is formed at least the third pattern PA3 passes through the third illumination field IA3 due to third exposure light EL3, and thereby moves the third mask M3 in the Y axis direction. Furthermore, the control unit 7, when exposing the substrate P, controls the fourth mask stage 4 so that a fourth pattern forming field SA4 of the fourth mask M4 in which is formed at least the fourth pattern PA4 passes through the fourth illumination field IA4 due to the fourth exposure light EL4, and thereby moves the fourth mask M4 in the Z axis direction.

Next is a description of the projection optical system PL, with reference to FIG. 1. The projection optical system PL projects an image of the first pattern PA1 of the first mask M1 which is illuminated by the first exposure light EL1, an image of the second pattern PA2 of the second mask M2 which is illuminated by the second exposure light EL2, an image of the third pattern PA3 of the third mask M3 which is illuminated by the third exposure light EL3, and an image of the fourth pattern PA4 of the fourth mask M4 which is illuminated by the fourth exposure light EL4, onto the substrate P at a predetermined projection magnification. In the projection optical system PL of the present embodiment, the projection magnification is for example a reduction system of for example ¼, ⅕, or ⅛.

The projection optical system PL of the present embodiment has a first combining optical element 21 and a second combining optical element 22. The first combining optical element 21 combines the first exposure light EL1 from the first pattern PA1 and the second exposure light EL2 from the second pattern PA2. The second combining optical element 22 combines the third exposure light EL3 from the third pattern PA3 and the fourth exposure light EL4 from the fourth pattern PA4.

The projection optical system PL of the present embodiment includes a first optical system 31 that guides the first exposure light EL1 to the first combining optical element 21, a second optical system 32 that guides the second exposure light EL2 to the combining optical element 21, a third optical system 33 that guides the third exposure light EL3 to the second combining optical element 22, a fourth optical system 34 that guides the fourth exposure light EL4 to the second combining optical element 22, and a fifth optical system 35 that includes the final optical element FL. Each of the first, second, third, and fourth exposure lights EL1, EL2, EL3, and EL4 include the exposure lights from the first, second, third, and fourth patterns PA1, PA2, PA3, and PA4 that mutually differ. The first optical system 31 guides the first exposure light EL1 that is emitted from the first illumination system IL1 and passed through the first pattern PA1 to the first combining optical element 21, and the second optical system 32 guides the second exposure light EL2 that is emitted from the second illumination system IL2 and passed through the second pattern PA2 to the first combining optical element 21. Furthermore, the third optical system 33 guides the third exposure light EL3 that is emitted from the third illumination system IL3 and passed through the third pattern PA3 to the second combining optical element 22. The fourth optical system 34 guides the fourth exposure light EL4 that is emitted from the fourth illumination system IL4 and passed through the fourth pattern PA4 to the second combining optical element 22.

The first combining optical element 21 of the present embodiment includes a branching optical element (half mirror) that branches the respective optical paths of the incident first and second exposure lights EL1 and EL2. The projection optical system PL combines a portion of the first exposure light EL1 from the first pattern PA1 which is branched by the first combining optical element 21 and a portion of the second exposure light EL2 from the second pattern PA2 which is branched by the first combining optical element 21. Similarly, the second combining optical element 22 of the present embodiment includes a branching optical element (half mirror) that branches the respective optical paths of the incident third and fourth exposure lights EL3 and EL4. The projection optical system PL combines a portion of third exposure light EL3 from the third pattern PA3 which is branched by the second combining optical element 22 and a portion of the fourth exposure light EL4 from the fourth pattern PA4 which is branched by the second combining optical element 22.

The projection optical system PL is provided with an optical member 40 that has a first reflecting surface 41 that is disposed in a first light path BR1 that is the light path of the first and second exposure lights EL1 and EL2 from the first combining optical element 21, and a second reflecting surface 42 that is disposed in a second light path BR2 that is the light path of the third and fourth exposure lights EL3 and EL4 from the second combining optical element 22. The first and second exposure lights EL1 and EL2 that travel along the first light path BR1, by passing the first reflecting surface 41, are guided to the one final optical element FL of to fifth optical system 35. The third and fourth exposure lights EL3 and EL4 that travel along the second light path BR2, by passing the second reflecting surface 42, are guided to the one final optical element FL of the fifth optical system 35.

In the present embodiment the optical member 40 includes a prism. The first reflecting surface 41 and the second reflecting surface 42 are at a position (or in the vicinity thereof) that is optically conjugate with the first, second, third, and fourth exposure fields AR1, AR2, AR3, and AR4. In the present embodiment, first reflecting surface 41 and the second reflecting surface 42 are slanting surfaces that slant with respect to the XY plane. The ridge line (peak) of the first reflecting surface 41 and the second reflecting surface 42 is parallel with the X axis. A convex portion that protrudes toward the fifth optical system 35 that includes the final optical element FL is formed in the optical member 40 by the first reflecting surface 41 and the second reflecting surface 42. The cross-sectional shape of the convex portion of the optical member 40 that is parallel with the YZ plane is formed in a V shape by the first reflecting surface 41 and the second reflecting surface 42.

The projection optical system PL of the present embodiment is capable of irradiating the first exposure light EL1 and the second exposure light EL2 from the first combining optical element 21 onto the first exposure field AR1 and the second exposure field AR2 via the first reflecting surface 41 and the final optical element FL. The projection optical system PL is capable of irradiating the third exposure light EL3 and the fourth exposure light EL4 from the second combining optical element 22 onto the third exposure field AR3 and the fourth exposure field AR4 via the second reflecting surface 42 and the final optical element FL.

In the present embodiment, each of the first, second, third, fourth, and fifth optical systems 31, 32, 33, 34, and 35 have a plurality of refractive optical elements each having a predetermined refracting power and form an image of a pattern once. Accordingly, the number of image forming times by the optical system (refractive optical system) that is arranged between the first pattern PA1 and the first exposure field AR1 is twice. The number of image forming times by the optical system (refractive optical system) that is arranged between the second pattern PA2 and the second exposure field AR2 is also twice. The number of image forming times by the optical system (refractive optical system) that is arranged between the third pattern PA3 and the third exposure field AR3 is also twice. The number of image forming times by the optical system (refractive optical system) that is arranged between the fourth pattern PA4 and the fourth exposure field AR4 is also twice.

Next is a description of the substrate stage 5. The substrate stage 5 is capable of moving on a base member BP at adjacent to the light emission side of the projection optical system PL, that is, the image surface side of the projection optical system PL. The substrate stage 5 is capable of holding and moving the substrate P within a predetermined field including the first, second, third, and fourth exposure fields AR1, AR2, AR3, and AR4 which are irradiated by the first, second, third, and fourth exposure lights EL1, EL2, EL3, and EL4. As shown in FIG. 1, the substrate stage 5 has a substrate holder 5H that holds the substrate P. The substrate holder 5H holds the substrate P so that the surface of the substrate P and the XY plane are substantially parallel. The substrate stage 5 is moveable by driving of a substrate stage drive device 5D including an actuator such as a linear motor, in directions of 6 degrees of freedom of the X axis, the Y axis, the Z axis, the θX, the θY, and the θZ directions, on the base member BP in the state of the substrate P held on the substrate holder 5H.

The position information of the substrate stage 5 (and in turn the substrate P) is measured by a laser interferometer 65 of the measurement system 6. The laser interferometer 65 measures the position information related to the X axis, the Y axis, and the θZ directions of the substrate 5 using a reflecting surface 65K which is provided on the substrate 5. Furthermore, the surface information (position information related to the Z axis, the θX, and the θY directions) of the surface of the substrate P held on the substrate stage 5 is detected by a focus leveling system (not shown in the figure). The control unit 7 drives the substrate stage drive device 5D based on the measurement result of the laser interferometer 65 and the detection result of the focus leveling detection system, and performs position control of the substrate P held in the substrate stage 5.

The focus leveling detection system measures the position information of the substrate in the Z-axis direction at a plurality of measurement points respectively to thereby detect the surface position information of the substrate, disclosed for example in U.S. Pat. No. 6,608,681. At least some of the plurality of measurement points can be set within the exposure field, and all of the measurement points can be set outside the exposure field. Furthermore, the laser interferometer can be able to measure position information of the substrate stage in the Z axis, the θX and the θY directions. This is disclosed in detail for example in Published Japanese Translation No. 2001-510577 of PCT International Publication (corresponding PCT International Publication No. WO 1999-28790). In this case, it is not necessary to provide the focus leveling detection system so as to be able to measure the position information of the substrate in the Z-axis direction during the exposure operation, and position control of the substrate in relation to the Z axis, the θX and the θY directions can be performed using the measurement results of the laser interferometer, at least during the exposure operation.

Figure 3:
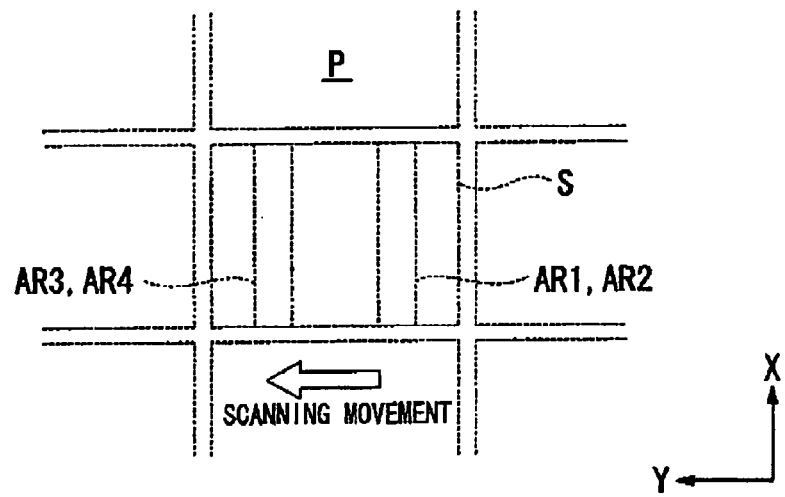
FIG. 3 is a schematic diagram showing a relationship between a shot region on a substrate and each exposure field, according to the first embodiment.

FIG. 3 is a schematic view showing the positional relationship of the shot field S on the substrate P and the first, second, third, and fourth exposure fields AR1, AR2, AR3, and AR4. As shown in FIG. 3, the first exposure field AR1 due to the first exposure light EL1 on the substrate P is set in a rectangular shape (slit shape) with the X-axis direction as the longitudinal direction. Furthermore, the second exposure field AR2 due to the second exposure light EL2 on the substrate P is set in a rectangular shape (slit shape) with the X-axis direction as the longitudinal direction. Furthermore, the third exposure field AR3 due to the third exposure light EL3 on the substrate P is set in a rectangular shape (slit shape) with the X-axis direction as the longitudinal direction. Furthermore, the fourth exposure field AR4 due to the fourth exposure light EL4 on the substrate P is set in a rectangular shape (slit shape) with the X-axis direction as the longitudinal direction. In the present embodiment, the first exposure field AR1 and the second exposure field AR2 are overlapped, and the third exposure field AR3 and the fourth exposure field AR4 are overlapped. Furthermore, the first and second exposure fields AR1 and AR2 and the third and fourth exposure fields AR3 and AR4 are separated in the Y axis direction (scanning direction of the substrate P). In the present embodiment, the first exposure field AR1 on which the first exposure light EL1 is irradiated, the second exposure field AR2 on which the second exposure light EL2 is irradiated, the third exposure field AR3 on which the third exposure light EL3 is irradiated, and the fourth exposure field AR4 on which the fourth exposure light EL4 is irradiated are the projection fields of the projection optical system PL.

The substrate stage 5 is capable of moving the shot field S on the substrate P in the Y axis direction with respect to the first, second, third, and fourth exposure fields AR1, AR2, AR3, and AR4. The control unit 7 controls the substrate stage 5 and thereby moves the substrate P in the Y axis direction so that the shot field S on the substrate P passes through the first, second, third, and fourth exposure fields AR1, AR2, AR3, and AR4 due to the first, second, third, and fourth exposure lights EL1, EL2, EL3, and EL4.

Next is a description of a method of exposing the substrate P using the exposure apparatus EX having the above construction.

The first mask M1 is loaded on the first mask stage 1, the second mask M2 is loaded on the second mask stage 2, the third mask M3 is loaded on the third mask stage 3, and the fourth mask M4 is loaded on the fourth mask stage 4. After the substrate P is loaded onto the substrate stage 5, the control unit 5 executes predetermined processing such as adjustment of the positional relationship of the first pattern PA1 of the first mask M1, the second pattern PA2 of the second mask M2, the third pattern PA3 of the third mask M3, the fourth pattern PA4 of the fourth mask M4, and the shot field S on the substrate P. Once the predetermined processing is completed, the control unit 7 starts exposure of the shot field S of the substrate P.

The first exposure light EL1 that is emitted from the first illumination system IL1 illuminates the first pattern PA1 of the first mask M1 on the first mask stage 1. The second exposure light EL2 that is emitted from the second illumination system IL2 illuminates the second pattern PA2 of the second mask M2 on the second mask stage 2. The third exposure light EL3 that is emitted from the third illumination system IL3 illuminates the third pattern PA3 of the third mask M3 on the third mask stage 3. The fourth exposure light EL4 that is emitted from the fourth illumination system IL4 illuminates the fourth pattern PA4 of the fourth mask M4 on the fourth mask stage 4.

The first exposure light EL1 from the first pattern PA1 of the first mask M1 is incident on the first combining optical element 21 via the first optical system 31. A portion of the first exposure light EL1 from the first pattern PA1 goes through a predetermined surface 21A of the first combining optical element 21, passes the first reflecting surface 41, is guided to the final optical element FL of the fifth optical system 35, and is irradiated on the first exposure field AR1. The image of the first pattern PA1 is formed based on the first exposure light EL1 that is irradiated on the first exposure field AR1.

Furthermore, the second exposure light EL2 from the second pattern PA2 of the second mask M2 is incident on the first combining optical element 21 via the second optical system 32. A portion of the second exposure light EL2 from the second pattern PA2 is reflected by the predetermined surface 21A of the first combining optical element 21, passes the first reflecting surface 41, is guided to the final optical element FL of the fifth optical system 35, and is irradiated on the second exposure field AR2. The image of the second pattern PA2 is formed based on the second exposure light EL2 that is irradiated on the second exposure field AR2.

The third exposure light EL3 from the third pattern PA3 of the third mask M3 is incident on the second combining optical element 22 via the third optical system 33. A portion of the third exposure light EL3 from the third pattern PA3 is reflected by a predetermined surface 22A of the second combining optical element 22, passes the second reflecting surface 42, is guided to the final optical element FL of the fifth optical system 35, and is irradiated on the third exposure field AR3. The image of the third pattern PA3 is formed based on the third exposure light EL3 that is irradiated on the third exposure field AR3.

Furthermore, the fourth exposure light EL from the fourth pattern PA4 of the fourth mask M4 is incident on the second combining optical element 22 via the fourth optical system 34. A portion of the fourth exposure light EL4 from the fourth pattern PA4 goes through the predetermined surface 22A of the second combining optical element 22, passes the second reflecting space 42, is guided to the final optical element FL of the fifth optical system 35, and is irradiated on the fourth exposure field AR4. The image of the fourth pattern PA4 is formed based on the fourth exposure light EL4 that is irradiated on the fourth exposure field AR4.

In the present embodiment, the first, second, third, and fourth patterns PA1, PA2, PA3, and PA4 of the first, second, third, and fourth masks M1, M2, M3, and M4 are respectively illuminated with the first, second, third, and fourth exposure lights EL1, EL2, EL3, and EL4 while moving the shot field S on the substrate P in the scanning direction (the Y axis detection) using the substrate stage 5 in synchronous with the movement in the scanning directions (the Y axis direction and the Z axis direction) of the first, second, third, and fourth masks M1, M2, M3, and M4 by the first, second, third, and fourth mask stages 1, 2, 3, and 4 under the control of the control unit 7. The corresponding first, second, third, and fourth exposure lights EL1, EL2, EL3, and EL4 are respectively irradiated on the first, second, third, and fourth exposure fields AR1, AR2, AR3, and AR4 on the substrate P, whereby the shot field S on the substrate P is multiply exposed by the images of the first, second, third, and fourth patterns PA1, PA2, PA3, and PA4.

Under the control of the control unit 7, while monitoring the position information of the first mask stage 1, the second mask stage 2, the third mask stage 3, the fourth mask stage 4, and the substrate stage 5 with the measurement system 6, movement of the substrate P in the Y-axis direction with respect to the first, second, third, and fourth exposure fields AR1, AR2, AR3, and AR4, movement of the first mask M1 in the Z-axis direction with respect to the first illumination field IA1, movement of the second mask M2 in the Y-axis direction with respect to the second illumination field IA2, movement of the third mask M3 in the Y-axis direction with respect to the third illumination field IA3, and movement of the fourth mask M4 in the Z-axis direction with respect to the fourth illumination field IA4 are synchronously performed. The first, second, third, and fourth exposure lights EL1, EL2, EL3, and EL4 are respectively irradiated on the first, second, third, and fourth exposure fields AR1, AR2, AR3, and AR4, and the shot field SH on the substrate P is multiply exposed. In the present embodiment, during exposure of the shot field S on the substrate P, for example, when the substrate P is moved in the +Y direction, the first mask M1 is moved in the +Z direction, the second mask M2 is moved in the +Y direction, the third mask M3 is moved in the +Y direction, and the fourth mask M4 is moved in the −Z direction.

In the present embodiment, in one round of the scanning operation it is possible to multiply expose the shot field S on the substrate P with the image of the first pattern PA1, the image of the second pattern PA2, the image of the third pattern PA3, and the image of the fourth pattern PA4. The photosensitive material layer of the shot field S on the substrate P is multiply exposed by the first exposure light EL1 irradiated onto the first exposure field AR1, the second exposure light EL2 irradiated onto the second exposure field AR2, the third exposure light EL3 irradiated onto third exposure field AR3, and the fourth exposure light EL4 irradiated onto the fourth exposure field AR4 without going through development steps and the like.

Furthermore, a plurality of shot fields S are provided on the substrate P. Under the control of the control unit 7, the scanning operation in the −Y direction on the substrate P and the scanning operation in the +Y direction are repeated, and so the plurality of shot fields S on the substrate P are in turn multiply exposed.

As described above, in the present embodiment, four pattern images are formed (projected) on four exposure fields irradiated by four corresponding exposure lights, and the shot field S on the substrate P can be multiply exposed with good efficiency by those four pattern images. Furthermore, in the present embodiment, by irradiating the respective first to fourth exposure lights EL1 to EL4 on the respective first to fourth exposure fields AR1 to AR4, and moving the substrate P in the Y axis direction so that the shot field S on the substrate P passes through the first to fourth exposure fields AR1 to AR4, the shot field S on the substrate P can be multiply exposed with good efficiency. In the present embodiment, when the shot field S on the substrate P is multiply exposed, in one round of the scanning operation, one shot field S can be exposed by the images of the first to fourth patterns PA1 to PA4, which is advantageous for improving the throughput. Moreover, by repeating the scanning operation in the −Y direction on the substrate P and the scanning operation in the +Y direction, a plurality of shot fields S on the substrate P can be multiply exposed with good efficiency. Furthermore, multiply exposing one shot field S in one round of the scanning operation can form the images of the first to fourth patterns PA1 to PA4 within each shot field S with a desired positional relationship.

Note that, in the present embodiment, the first to fourth mask stages 1 to 4 that hold the first to fourth masks M1 to M4 can be provided to be capable of fine movement in the light path direction of the first to fourth exposure lights EL1 to EL4 (i.e., the optical axis direction of the first to fourth optical systems 31 to 34). Thereby, it is possible to adjust the positions of the image surfaces on which each of the first to fourth patterns PA1 to PA4 are formed by the projection optical system PL.

Second Embodiment

A second embodiment shall henceforth be described with reference to the schematic drawing of FIG. 4. In the following description, components the same as or similar to the above-mentioned embodiment are denoted by the same reference symbols, and their description is simplified or omitted.

The characteristic part of the second embodiment that differs from the first embodiment described above is the point of not arranging the first reflecting surface 41 in the first light path BR1 that is the light path of the exposure lights from the first combining optical element 21 and not arranging the second reflecting surface 42 in the second light path BR2 that is the light path of the exposure lights from the second combining optical element 22. That is, as shown in FIG. 4, the projection optical system PL of the present embodiment has a constitution that is without the first reflecting surface 41 and the second reflecting surface 42.

Figure 4:
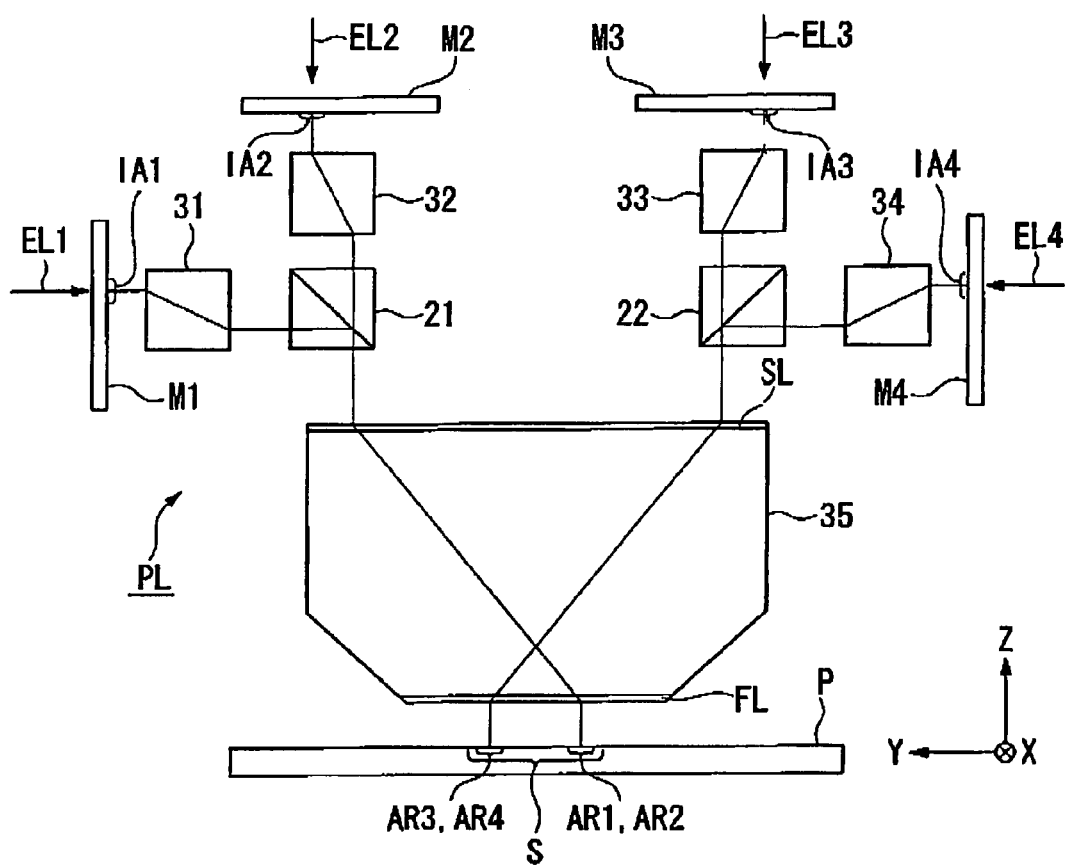
FIG. 4 is a schematic diagram showing an exposure apparatus according to a second embodiment.

As shown in FIG. 4, the projection optical system PL includes the first combining optical element 21 and the second combining optical element 22, the first optical system 31 that guides the first exposure light EL1 from the first pattern PA1 to the first combining optical element 21, the second optical system 32 guides the second exposure light EL2 from the second pattern PA2 to the first combining optical element 21, the third optical system 33 that guides the third exposure light EL3 from the third pattern PA3 to the second combining optical element 22, the fourth optical system 34 that guides the fourth exposure light EL4 from the fourth pattern PA4 to the second combining optical element 22, and the fifth optical system 35 that includes the final optical element FL. The first and second exposure lights EL1 and EL2 from the first combining optical element 21 are made incident on the one incident side optical element SL of the fifth optical system 35, and the third and fourth exposure lights EL3 and EL4 from the second combining optical element 22 are made incident on the one incident side optical element SL of the fifth optical system 35. The first, second, third, and fourth exposure lights EL1, EL2, EL3, and EL4 that are incident on the incident side optical element SL are respectively irradiated on the first, second, third, and fourth exposure fields AR1, AR2, AR3, and AR4 via the final optical element FL. Thereby, the images of the first, second, third, and fourth patterns PA1, PA2, PA3, and PA4 are respectively formed on the first, second, third, and fourth exposure fields AR1, AR2, AR3, and AR4.

Even in the present embodiment, it is possible to multiply expose the shot field S on the substrate P with good efficiency by the images of the first to fourth patterns PA1 to PA4 that are formed based on the first to fourth exposure lights EL1 to EL4 irradiated on the first to fourth exposure fields AR1 to AR4, respectively.

Note that the first and second embodiments above multiply expose (quadruple expose) the shot field S on the substrate P by the four exposure lights EL1 to EL4, however, it is possible to multiply expose (triple expose) with three exposure lights. For example, by stopping the irradiation of the fourth exposure light EL4 from the fourth mask M4, it is possible to multiply expose (triple expose) the shot field S on the substrate P with the first to third exposure lights EL1 to EL3.

Furthermore, the first and second embodiments given above can be made to multiply expose the shot field S on the substrate P using five or more exposure lights. For example, in FIG. 1, a fifth exposure light from a fifth pattern is made incident on at least one of the first combining optical element 21 and the second combining optical element 22. Thereby, at least one of the first combining optical element 21 and the second combining optical element 22 combines at least three exposure lights, and the projection optical system PL can irradiate at least five exposure lights on the shot field S on the substrate P. Thereby, the exposure apparatus EX can multiply expose the shot field S on the substrate P using five or more exposure lights.

In the first and second embodiments above, the first exposure field AR1 and the second exposure field AR2 are overlapped, and the third exposure field AR3 and the fourth exposure field AR4 are overlapped, and the first and second exposure fields AR1, AR2 and the third and fourth exposure fields AR3, AR4 are separated in the Y-axis direction (scanning direction of the substrate P). However, each of the first, second, third, and fourth exposure fields AR1, AR2, AR3, and AR4 can be separated in the Y-axis direction, and only two exposure fields among the four exposure fields can be overlapped.

Third Embodiment

A third embodiment shall henceforth be described with reference to the schematic drawing of FIG. 5. In the following description, components the same as or similar to the above-mentioned embodiments are denoted by the same reference symbols, and their description is simplified or omitted.

The characteristic part of the present embodiment is the point of an exposure light EL25 from a third combining optical element 23, which is different from the first combining optical element 21 and the second combining optical element 22, to be guided to at least one of the first combining optical element 21 and the second combining optical element 22.

Figure 5:
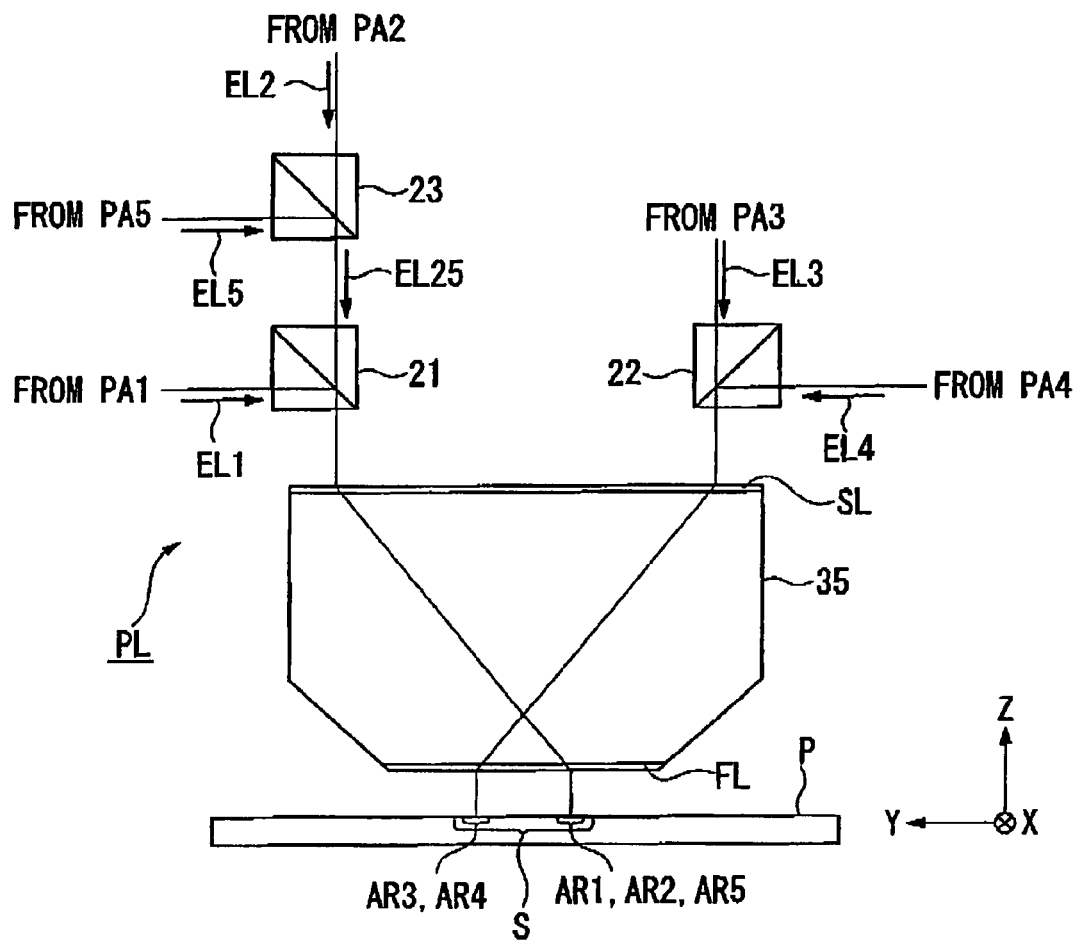
FIG. 5 is a schematic diagram showing an exposure apparatus according to a third embodiment.

In FIG. 5, the projection optical system PL includes the first combining optical element 21, the second combining optical element 22, and the third combining optical element 23. The first exposure light EL1 from the first pattern PA1 and the exposure light EL25 from the third combining optical element 23 are guided to the first combining optical element 21, and the third exposure light EL3 from the third pattern PA3 and the fourth exposure light EL4 from the fourth pattern PA4 are guided to the second combining optical element 22. In the present embodiment, the second exposure light EL2 from the second pattern PA2 and a fifth exposure light EL5 from a fifth pattern PA5 are guided to the third combining optical element 23. The third combining optical element 23 combines the second exposure light EL2 and the fifth exposure light EL5, and irradiates the combined exposure light EL25 toward the first combining optical element 21. In the present embodiment, the shot field S on the substrate P is multiply exposed by the five exposure lights EL1 to EL5.

Even in the present embodiment, it is possible to multiply expose the shot field S on the substrate P with good efficiency by the images of the first to fifth patterns PA1 to PA5 that are formed based on the first to fifth exposure lights EL1 to EL5 irradiated on the first to fifth exposure fields AR1 to AR5, respectively.

Fourth Embodiment

Figure 6:
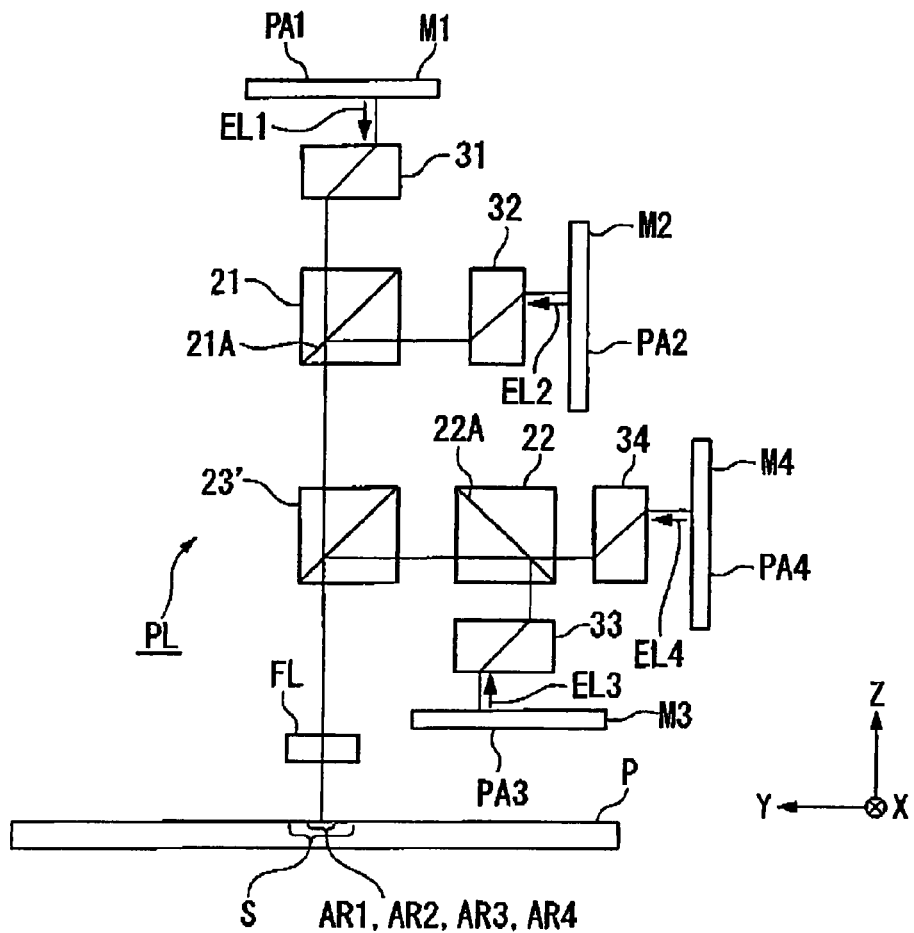
FIG. 6 is a schematic diagram showing an exposure apparatus according to a fourth embodiment.

A fourth embodiment shall henceforth be described with reference to the schematic drawing of FIG. 6. In the following description, components the same as or similar to the above-mentioned embodiments are denoted by the same reference symbols, and their description is simplified or omitted.

The projection optical system PL includes the first combining optical element 21, the second combining optical element 22, and the third combining optical element 23' to which are guided the first and second exposure lights EL1, EL2 from the first combining optical element 21 and the third and fourth exposure lights EL3, EL4 from the second combining optical element 22. Furthermore, the projection optical system PL includes the first optical system 31 that guides the first exposure light EL1 from the first pattern PA1 to the first combining optical element 21, the second optical system 32 that guides the second exposure light EL2 from the second pattern PA2 to the first combining optical element 21, the third optical system 33 that guides the third exposure light EL3 from the third pattern PA3 to the second combining optical element 22, and the fourth optical system 34 that guides the fourth exposure light EL4 from the fourth pattern PA4 to the second combining optical element 22.

The first exposure light EL1 from the first pattern PA1 of the first mask M1 is made incident on the first combining optical element 21 via the first optical system 31. A portion of the first exposure light EL1 from the first pattern PA1, by passing through the predetermined surface 21A of the first combining optical element 21, is guided to the third combining optical element 23'.

Furthermore, the second exposure light EL2 from the second pattern PA2 of the second mask M2 is made incident on the first combining optical element 21 via the second optical system 32. A portion of the second exposure light EL2 from the second pattern PA2, by being reflected by the predetermined surface 21A of the first combining optical element 21, is guided to the third combining optical element 23'.

Furthermore, the third exposure light EL3 from the third pattern PA3 of the third mask M3 is made incident on the second combining optical element 22 via the third optical system 33. A portion of the third exposure light EL3 from the third pattern PA3, by being reflected by the predetermined surface 22A of the second combining optical element 22, is guided to the third combining optical element 23'.

Furthermore, the fourth exposure light EL4 from the fourth pattern PA4 of the fourth mask M4 is made incident on the second combining optical element 22 via the fourth optical system 34. A portion of the fourth exposure light EL4 from the fourth pattern PA4, by passing through the predetermined surface 22A of the second combining optical element 22, is guided to the third combining optical element 23'.

The first, second, third, and fourth exposure lights EL1, EL2, EL3, and EL4 that are incident on the third combining optical element 23' are combined by the third combining optical element 23' and, via the final optical element FL, irradiated on the first, second, third, and fourth exposure fields AR1, AR2, AR3, and AR4. The images of the first, second, third, and fourth patterns PA1, PA2, PA3, and PA4 are formed based on the first, second, third, and fourth exposure lights EL1, EL2, EL3, and EL4 that are irradiated on the first, second, third, and fourth exposure fields AR1, AR2, AR3, and AR4, respectively.

Figure 7:
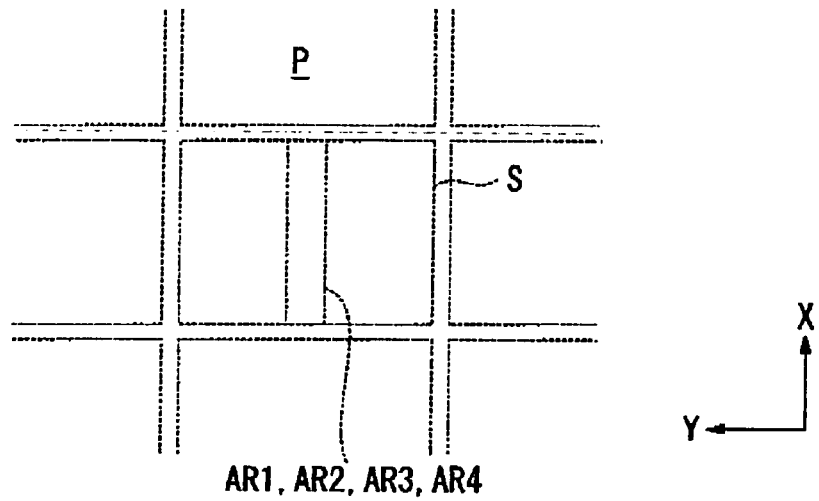
FIG. 7 is a schematic diagram showing a relationship between a shot region on a substrate and each exposure field, according to the fourth embodiment.

FIG. 7 is a schematic view showing the positional relationship of the shot field S on the substrate P and the first, second, third, and fourth exposure fields AR1, AR2, AR3, and AR4. As shown in FIG. 7, the first exposure field AR1, the second exposure field AR2, the third exposure field AR3, and the fourth exposure field AR4 are overlapped in relation to at least the Y axis direction (scanning direction of the substrate P).

Even in the present embodiment, it is possible to multiply expose the shot field S on the substrate P with good efficiency by the images of the first to fourth patterns PA1 to PA4 that are formed based on the first to fourth exposure lights EL1 to EL4 irradiated on the first to fourth exposure fields AR1 to AR4, respectively.

Note that the fourth embodiment multiply exposes (quadruple expose) the shot field S on the substrate P by the four exposure lights EL1 to EL4, however, it is possible to multiply expose (triple expose) with three exposure lights. For example, by stopping the irradiation of the fourth exposure light EL4 from the fourth mask M4, it is possible to multiply expose (triple expose) the shot field S on the substrate P with the first to third exposure lights EL1 to EL3.

Furthermore, the fourth embodiment above can be made to multiply expose the shot field S on the substrate P using five or more exposure lights. For example, in FIG. 6, a fifth exposure light from a fifth pattern is made incident on at least one of the first combining optical element 21, the second combining optical element 22, and the third combining optical element 23'. Thereby, at least one of the first combining optical element 21, the second combining optical element 22, and the third combining optical element 23' combines at least three exposure lights, and the projection optical system PL can irradiate at least five exposure lights on the shot field S on the substrate P.

Fifth Embodiment

Figure 8:
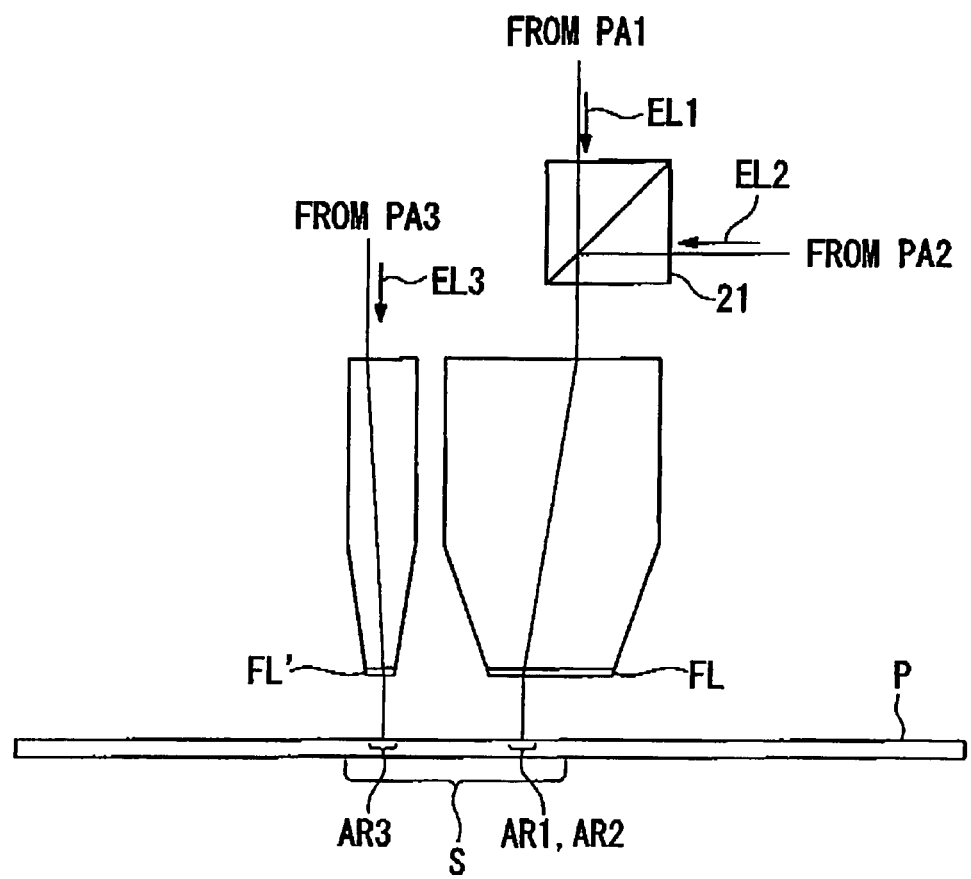
FIG. 8 is a schematic diagram showing an exposure apparatus according to a fifth embodiment.

A fifth embodiment shall henceforth be described with reference to the schematic drawing of FIG. 8. In the following description, components the same as or similar to the above-mentioned embodiments are denoted by the same reference symbols, and their description is simplified or omitted.

In each of the embodiments described above, all of the exposure lights EL1 to EL4, which are emitted from respective illumination systems and passed through respective patterns, are guided to one optical element FL. In the present embodiment, as shown in the schematic drawing of FIG. 8, at least two exposure lights EL1 and EL2 among a plurality (three or more) of exposure lights can be guided to the final optical element FL via the combining optical element 21, while the remaining exposure light EL3 can be guided to an optical element FL' that is separate from the final optical element FL. Even in the present embodiment, it is possible to multiply expose the shot field S on the substrate P with good efficiency by the images of the first to third patterns PA1 to PA3 that are formed based on the first to third exposure lights EL1 to EL3 irradiated on the first to third exposure fields AR1 to AR3, respectively.

In the abovementioned first to fifth embodiments, the case of using a half mirror as the combining optical element was described as an example. However, for example a polarization beam splitter can also be used as the combining optical element.

In the aforementioned embodiments, the projection optical system PL is not limited to that described above, and for example either an equal magnification system or a magnification system can be used. Furthermore, the projection optical system PL can be a refractive system which does not include a reflecting optical element, a reflecting system which does not include a refractive optical element, or a reflection/refraction system which includes both a reflecting optical element and a refractive optical element.

Furthermore, in the abovementioned respective embodiments, at least one of the size and the shape of the exposure fields can be mutually different. For example, the width in the X axis direction and/or the width in the Y axis direction of the first exposure field AR1 and the second exposure field AR2 can be different.

Furthermore, in the abovementioned respective embodiments, irradiation of the exposure light EL on each of the exposure fields is continued while the shot field S is passing through the exposure fields. However, the exposure light can be irradiated for only a portion of the period of time in which the shot field S passes through at least one exposure field. That is to say, it is acceptable to multiply expose only a portion within the shot field S.

In the abovementioned respective embodiments, an immersion method such as disclosed for example in PCT International Patent Publication No. WO 1999/49504 can be applied. That is, a liquid immersion field can be formed on the substrate P so as to cover each of the exposure fields, and each of the exposure lights can be irradiated onto the substrate P via the liquid. As the liquid, water (pure water) can be used. Other than water, for example a fluorocarbon fluid such as a perfluoropolyether (PFPE) or a fluorocarbon oil, or a cedar oil or the like can be used. Moreover as the liquid, a liquid with a refractive index that is higher than that of water with respect to the exposure light (for example a liquid with a refractive index of approximately 1.6 to 1.8) can be used. Furthermore, the final optical element FL can be formed from a material with a refractive index that is higher than that of quartz or fluorite (for example 1.6 or more). Here, a liquid with a refractive index that is higher than that of pure water (for example, 1.5 or higher) includes for example a predetermined liquid with a C—H bond and art O—H bond such as isopropanol with a refractive index of approximately 1.5 and glycerol (glycerine) with a refractive index of approximately 1.61; a predetermined liquid (organic solvent) such as hexane, heptane, decane; and Decalin (Daeydronaphthalene) with a refractive index of approximately 1.60. Alternatively, the liquid can be one that is a mixture of two or more types of optional liquids among these predetermined liquids, or one that is made by adding (mixing) at least one of these liquids to/with pure water. Alternatively, as the liquid, one in which an acid or a base such as $H^+$, $Cs^+$, and $K^+$, or $Cl^-$, $SO_4^{2-}$, and $PO_4^{2-}$ is added to (mixed with) pure water can be used, and a liquid in which fine particles of for example Al oxide are added to (mixed with) pure water can be used. Furthermore, the liquid is preferably one for which the light absorption coefficient is small, the temperature dependency is small, and which is stable with respect to the photosensitive material (or top coat film or anti-reflection film, etc.) painted on the surface of the projection optical system and/or the substrate. It is possible to use a supercritical solution as the liquid. Furthermore, a top coat film and the like that protects the photosensitive material and substrate from the liquid can be provided on the substrate. Furthermore, a final optical element may be formed from quartz (silica) or a single crystal material of a fluoride compound such as calcium fluoride (fluorite), barium fluoride, strontium fluoride, lithium fluoride, and sodium fluoride, and may be formed from a material with a refractive index that is higher than that of quartz or fluorite (for example 1.6 or more). As materials with a refractive index that is 1.6 or more, it is possible to use sapphire and germanium dioxide, etc., disclosed in PCT International Patent Publication No. WO 2005/059617, and potassium chloride (refractive index of approximately 1.75) disclosed in PCT International Patent Publication No. WO 2005/059618.

In the case of using an immersion method, it is acceptable to fill the light path on the object surface side of the final optical element in addition to the light path of the image surface side of the final optical element with a liquid, as disclosed in PCT International Patent Publication No. WO 2004/019128 (corresponding U.S. Patent Application Publication No. 2005/0248856). Moreover, a thin film that has lyophilicity and/or a dissolution prevention mechanism may be formed on a portion of the surface of the final optical element (including at least the contact surface with the liquid) or all thereof. Note that silica has a high affinity with liquid, and a dissolution prevention mechanism is not required, but it is preferable to at least form a dissolution prevention film in the case of fluorite.

The above respective embodiments are ones which measure the position information of the mask stage and the substrate stage using an interferometer system as the measurement system 6. However, the invention is not limited to this, and for example an encoder system that detects a scale (diffraction grating) provided for example on the top surface of the substrate stage may be used. In this case, as a hybrid system which uses both the interferometer system and the encoder system, preferably the measurement results of the interferometer system are used to perform calibration on the measurement results of the encoder system. Furthermore, the interferometer system and the encoder system may be alternately used, or both may be used, to perform position control of the substrate stage.

As the substrate P in the abovementioned respective embodiments, not only a semiconductor wafer for manufacturing a semiconductor device, but also a glass substrate for a display device, a ceramic wafer for a thin film magnetic head, or a mask or an original plate of a reticle (synthetic quartz or silicon wafer) used in an exposure apparatus, or a film member etc. can be used. Furthermore, the shape of the substrate is not limited to a circle, and may be another shape such as a rectangle.

Furthermore, the exposure apparatus EX of the aforementioned embodiments may be provided with a measurement stage that is capable of moving independency of the substrate stage that holds the substrate, and on which is mounted a measurement member (for example, a reference member formed with a reference mark, and/or various types of photoelectronic sensors), as disclosed for example in Japanese Unexamined Patent Application, First Publication No. H11-135400 (corresponding PCT International Publication No. WO 1999/23692), and Japanese Unexamined Patent Application, First Publication No. 2000-164504 (corresponding U.S. Pat. No. 6,897,963).

In the abovementioned respective embodiments, a mask for forming a pattern was used, but it is possible to use instead an electronic mask that generates a variable pattern (also called a variable forming mask, an active mask, or a pattern generator). As an electronic mask, it is possible to use a deformable micro-mirror device or digital micro-mirror device (DMD) that is one type of non-light emitting type image display element (also called a spatial light modulator (SLM)). A DMD has a plurality of reflecting elements (micromirrors) that are driven based on predetermined electronic data. This plurality of reflecting elements are arrayed in a two-dimensional matrix on the surface of the DMD and are driven individually to reflect and deflect the exposure light. The angle of each reflecting element with reflect to the reflecting surface is adjusted. The operation of the DMD can be controlled by the control unit. The control unit drives the reflecting elements of the DMD based on the electronic data (pattern information) according to the pattern to be formed on the substrate and thus patterns with the reflecting elements the exposure light that is irradiated by the illumination system. By using the DMD, compared to the case of exposing by using a mask (reticle) on which is formed a pattern, mask changing work and an operation to align the position of the mask in the mask stage are unnecessary when changing the pattern. In an exposure apparatus that employs an electronic mask, the substrate may simply move in the X-axis and Y-axis directions by a substrate stage without providing a mask stage. An exposure apparatus that uses a DMD is disclosed for example in Japanese Unexamined Patent Application, First Publication No. H08-313842, Japanese Unexamined Patent Application, First Publication No. 2004-304135, and U.S. Pat. No. 6,778,257.

The present invention can also be applied to a multistage type exposure apparatus provided with a plurality of substrate stages as disclosed for example in Japanese Unexamined Patent Application, First Publication No. H10-163099; Japanese Unexamined Patent Application, First Publication No. H10-214783 (corresponding U.S. Pat. No. 6,341,007, U.S. Pat. No. 6,400,441, U.S. Pat. No. 6,549,269, and U.S. Pat. No. 6,590,634), and Published Japanese Translation No. 2000-505958 of PCT International Publication (corresponding U.S. Pat. No. 5,969,441).

The types of exposure apparatuses EX are not limited to exposure apparatuses for semiconductor device manufacture that expose a semiconductor device pattern onto a substrate P, but are also widely applicable to exposure apparatuses for the manufacture of liquid crystal display devices and for the manufacture of displays, and exposure apparatuses for the manufacture of thin film magnetic heads, image pickup devices (CCDs), micro machines, MEMS, DNA chips, and reticles or masks.

As far as is permitted, the disclosures in all of the Japanese Patent Publications and U.S. Patents related to exposure apparatuses and the like cited in the above respective embodiments and modified examples, are incorporated herein by reference.

As described above, the exposure apparatus EX of the aforementioned embodiments is manufactured by assembling various subsystems, including the respective constituent elements, so that predetermined mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus from the various subsystems includes, for example, the mutual mechanical connection of the various subsystems, the wiring and connection of electrical circuits, and the piping and connection of the atmospheric pressure circuit. Naturally, before the process of assembling the exposure apparatus from these various subsystems, there are also the processes of assembling each individual subsystem. When the process of assembling the exposure apparatus from the various subsystems is completed, a comprehensive adjustment is performed to ensure the various accuracies of the exposure apparatus as a whole. Furthermore, it is preferable to manufacture the exposure apparatus in a clean room wherein, for example, the temperature and the cleanliness level are controlled.

Figure 9:
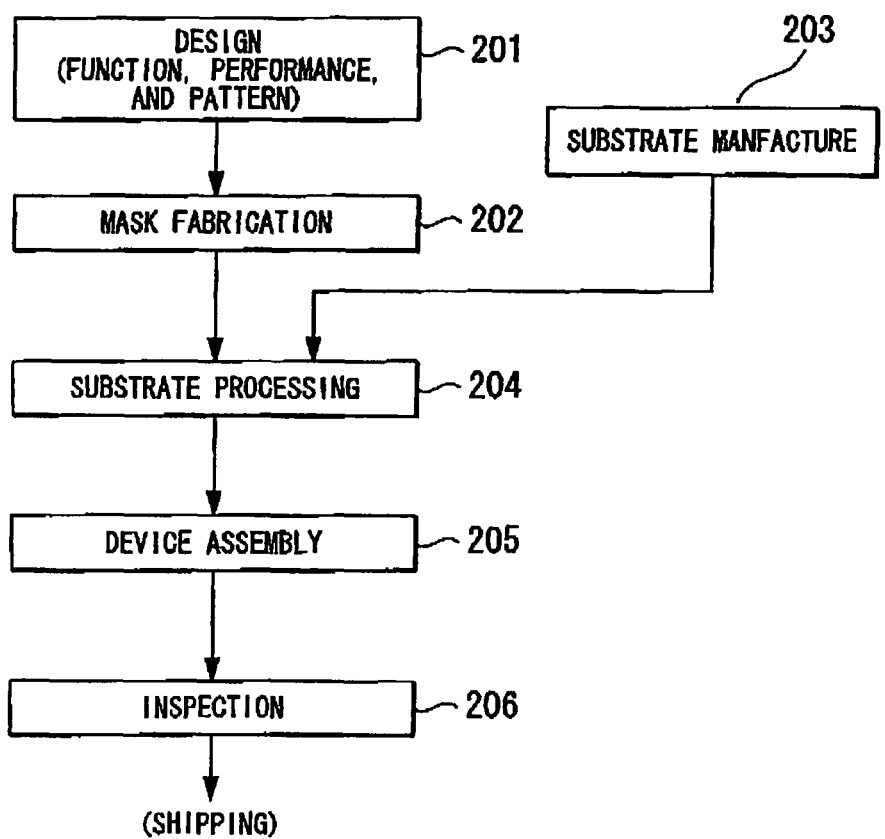
FIG. 9 is a flowchart that depicts one example of a process for fabricating a microdevice.

As shown in FIG. 9, microdevices such as semiconductor devices are manufactured by going through: a step 201 that designs the functions and performance of the microdevice; a step 202 that fabricates the mask (reticle) based on this design step; a step 203 that manufactures the substrate that serves as the base material of the device; a step 204 including substrate processing steps such as a process that exposes the pattern of the mask onto a substrate by means of the exposure apparatus EX of the aforementioned embodiments, a process for developing the exposed substrate, and a process for heating (curing) and etching the developed substrate; a device assembly step 205 (including treatment processes such as a dicing process, a bonding process, and a packaging process); and an inspection step 206, and so on.

According to the present invention, it is possible to restrict drops in throughput, multiply expose a substrate with good efficiency, and possible to improve the productivity of a device.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An exposure apparatus that exposes a substrate, comprising:
    an optical system that has one optical element to which at least two of three or more exposure lights are guided, and that irradiates three or more exposure fields with the three or more exposure lights,
    wherein a predetermined field on the substrate is multiply exposed by images of a plurality of patterns that are formed on the three or more exposure fields, at least parts of at least two images of the plurality of patterns simultaneously being exposed onto the substrate overlapped with each other in plan view of the substrate in two dimensions, and
    wherein a length of each of the three or more exposure fields is substantially equal to a length of the predetermined field such that each of the three or more exposure fields extends entirely across the predetermined field.

2. An exposure apparatus according to claim 1, wherein all of the three or more exposure lights are guided to the one optical element.

3. An exposure apparatus according to claim 1, wherein the one optical element faces a surface of the substrate.

4. An exposure apparatus according to claim 1, wherein the optical system includes a combining optical element that combines at least two exposure lights of the three or more exposure lights.

5. An exposure apparatus according to claim 4, wherein the optical system has a first combining optical element and a second combining optical element.

6. An exposure apparatus according to claim 5, wherein
    the optical system has a first reflecting surface that is disposed in a first light path that is a light path of exposure lights from the first combining optical element, and a second reflecting surface that is disposed in a second light path that is a light path of exposure lights from the second combining optical element, and
    the exposure light that travels along the first light path, by passing the first reflecting surface, is guided to the one optical element, and the exposure light that travels along the second light path, by passing the second reflecting surface, is guided to the one optical element.

7. An exposure apparatus according to claim 6, wherein the first reflecting surface and the second reflecting surface are at a position, or in a vicinity of the position, that is optically conjugate with the three or more exposure fields.

8. An exposure apparatus according to claim 5, wherein the optical system has a first optical system that guides a first exposure light to the first combining optical element, a second optical system that guides a second exposure light to the first combining optical element, a third optical system that guides a third exposure light to the second combining optical element, and a fourth optical system that guides a fourth exposure light to the second combining optical element.

9. An exposure apparatus according to claim 8, wherein the first exposure light, the second exposure light, the third exposure light, and the fourth exposure light respectively include exposure light from a first pattern, a second pattern, a third pattern, and a fourth pattern that mutually differ from each other.

10. An exposure apparatus according to claim 8, wherein at least one of the first exposure light, the second exposure light, the third exposure light, and the fourth exposure light includes exposure light from a third combining optical element that is different from the first combining optical element and the second combining optical element.

11. An exposure apparatus according to claim 1, wherein the predetermined field on the substrate is multiply exposed while relatively moving the plurality of exposure fields and the predetermined field on the substrate in a predetermined scanning direction.

12. An exposure apparatus according to claim 11, wherein at least two exposure fields of the plurality of exposure fields are separated in the predetermined direction.

13. An exposure apparatus according to claim 11, wherein at least two exposure fields of the plurality of exposure fields are partially overlapped in relation to the predetermined direction.

14. An exposure apparatus according to claim 1, further comprising:
   a first moving device that moves a plurality of masks having respective patterns in predetermined scanning directions with respect to the exposure lights, and
   a second moving device that moves the predetermined field on the substrate in a predetermined scanning direction with respect to the three or more exposure fields,
   wherein the predetermined field on the substrate is multiply exposed while moving the predetermined field on the substrate with the second moving device in the scanning direction synchronously with movement in the respective scanning directions of the plurality of masks by the first moving device.

15. A device manufacturing method comprising:
   exposing the substrate with the exposure light irradiated through the exposure apparatus of claim 1; and
   processing the exposed substrate to form the device.

16. An exposure apparatus that exposes a substrate comprising:
   a first system that guides four or more exposure lights to one optical element, the four or more exposure lights respectively comprising images of a plurality of patterns;
   a second system that guides the four or more exposure lights from the one optical element to a predetermined surface, at least parts of the images of the plurality of patterns of at least two exposure lights among the four or more exposure lights simultaneously being exposed onto the substrate overlapped with each other in two dimensions in plan view of the substrate in a first field on the predetermined surface, at least parts of the images of the plurality of patterns of at least two exposure lights among other exposure lights of the four or more exposure lights simultaneously being exposed onto the substrate overlapped with each other in two dimensions in plan view of the substrate in a second field on the predetermined surface, the first field and the second field being separated from each other; and
   a mover assembly that allows a relative movement between the first field and a predetermined area on the substrate and a relative movement between the second field and the predetermined area on the substrate,
   wherein a length of each of the first and second fields is substantially equal to a length of the predetermined area on the substrate such that each of the first and second fields extends entirely across the predetermined area on the substrate, the lengths of the first and second fields and of the predetermined area extending in a direction orthogonal to a direction of the relative movement.

17. An exposure method comprising:
   guiding four or more exposure lights to one optical element, the four or more exposure lights respectively comprising images of a plurality of patterns;
   guiding the four or more exposure lights from the one optical element to a predetermined surface, at least parts of the images of the plurality of patterns of at least two exposure lights among the four or more exposure lights simultaneously being exposed onto the substrate overlapped with each other in two dimensions in plan view of the substrate in a first field on the predetermined surface, at least parts of the images of the plurality of patterns of at least two exposure lights among other exposure lights of the four or more exposure lights simultaneously being exposed onto the substrate overlapped with each other in two dimensions in plan view of the substrate in a second field on the predetermined surface, the first field and the second field being separated from each other; and
   allowing a relative movement between the first field and a predetermined area on the substrate and a relative movement between the second field and the predetermined area on the substrate,
   wherein a length of each of the first and second fields is substantially equal to a length of the predetermined area on the substrate such that each of the first and second fields extends entirely across the predetermined area on the substrate, the lengths of the first and second fields and of the predetermined area extending in a direction orthogonal to a direction of the relative movement.

18. An exposure apparatus that exposes a substrate, comprising:
   a first system that guides three or more exposure lights to one optical element, the three or more exposure lights respectively comprising images of a plurality of patterns;
   a second system that guides the three or more exposure lights from the one optical element to a first field and a second field on a predetermined surface, the first field and the second field being separated apart from each other, at least parts of the images of the plurality of patterns of at least two exposure lights among the three or more exposure lights simultaneously being exposed onto the substrate overlapped with each other in at least one of the first and second fields on the predetermined surface; and
   a mover assembly that allows a relative movement in a scanning direction between a shot area on the substrate and the first and second fields, each of the first and second fields scanning a substantially whole of the shot area,
   wherein a length of each of the first and second fields in a direction orthogonal to the scanning direction is substantially equal to a length of the shot area in the direction orthogonal to the scanning direction such that each of the first and second fields extends entirely across the shot area.

19. An exposure apparatus according to claim 18, wherein an overlapping number of the images of the plurality of patterns in the first field is equal to that in the second field.

20. An exposure apparatus according to claim 18, wherein an overlapping number of the images of the plurality of patterns in the first field is different from that in the second field.

21. An exposure method comprising:
- guiding three or more exposure lights to one optical element, the three or more exposure lights respectively comprising images of a plurality of patterns;
- guiding the three or more exposure lights from the one optical element to a first field and a second field on a predetermined surface, at least parts of the images of the plurality of patterns of at least two exposure lights among the three or more exposure lights simultaneously being exposed onto the substrate overlapped with each other in at least one of the first and second fields on the predetermined surface; and
- allowing a relative movement in a scanning direction between a shot area on the substrate and the first and second fields, each of the first and second fields scanning a substantially whole of the shot area, wherein a length of each of the first and second fields in a direction orthogonal to the scanning direction is substantially equal to a length of the shot area in the direction orthogonal to the scanning direction such that each of the first and second fields extends entirely across the shot area.

22. An exposure method according to claim 21, wherein an overlapping number of the images of the plurality of patterns in the first field is equal to that in the second field.

23. An exposure method according to claim 21, wherein an overlapping number of the images of the plurality of patterns in the first field is different from that in the second field.

* * * * *